United States Patent
Song (10) Patent No.: US 12,422,467 B2
(45) Date of Patent: Sep. 23, 2025

(54) CIRCUIT BOARD AND MONITORING METHOD THEREFOR

(71) Applicant: Wiwynn Corporation, New Taipei (TW)

(72) Inventor: Gong-Bo Song, New Taipei (TW)

(73) Assignee: WIWYNN CORPORATION, New Taipei (TW)

(*) Notice: Subject to any disclaimer, the term of this patent is extended or adjusted under 35 U.S.C. 154(b) by 295 days.

(21) Appl. No.: 18/318,862

(22) Filed: May 17, 2023

(65) Prior Publication Data

US 2024/0310431 A1   Sep. 19, 2024

(30) Foreign Application Priority Data

Mar. 16, 2023   (TW) ................... 112109865

(51) Int. Cl.
| | | |
|---|---|---|
| G01R 31/28 | (2006.01) | |
| G01L 5/1623 | (2020.01) | |
| G01R 17/10 | (2006.01) | |
| H05K 1/02 | (2006.01) | |

(52) U.S. Cl.
CPC ........ G01R 31/2815 (2013.01); G01L 5/1623 (2020.01); H05K 1/0268 (2013.01); *G01R 17/105* (2013.01)

(58) Field of Classification Search
CPC . G01R 31/2815; G01R 17/105; G01L 5/1623; G01L 5/0028; H05K 1/0268
USPC ...................................................... 324/750.3
See application file for complete search history.

(56) References Cited

U.S. PATENT DOCUMENTS

| | | | | |
|---|---|---|---|---|
| 4,013,877 A | * | 3/1977 | Uram | F01K 23/108 290/40 R |
| 4,201,924 A | * | 5/1980 | Uram | F01K 23/108 290/40 R |
| 4,445,180 A | * | 4/1984 | Davis | F01D 17/24 290/40 R |
| 5,162,729 A | * | 11/1992 | Lusby | H05K 1/0268 324/763.01 |
| 6,292,340 B1 | * | 9/2001 | O'Regan | H02H 7/261 361/115 |
| 6,325,466 B1 | * | 12/2001 | Robertson | B60T 13/74 303/7 |
| 6,619,759 B2 | * | 9/2003 | Bradsen | B60T 13/662 188/3 R |

(Continued)

FOREIGN PATENT DOCUMENTS

| | | |
|---|---|---|
| CN | 103260352 A | 8/2013 |
| CN | 115752828 A | 3/2023 |

*Primary Examiner* — Christopher P Mcandrew
(74) *Attorney, Agent, or Firm* — McClure, Qualey & Rodack, LLP (57) ABSTRACT

A monitoring method is adapted for a circuit board. The circuit board includes a board body, a main circuit, and a standby circuit. The main circuit is located on the board body. The standby circuit is located on the board body, and is electrically connected to the main circuit. The standby circuit includes a first pressure detection circuit and a control circuit. The first pressure detection circuit is located at an area being monitored of the board body, and the control circuit outputs a first signal or a second signal according to a first detection value and a first predetermined range of the first pressure detection circuit.

19 Claims, 8 Drawing Sheets

(56) References Cited

U.S. PATENT DOCUMENTS

| | | | | |
|---|---|---|---|---|
| 7,504,589 | B2* | 3/2009 | Parker | H05K 1/0268 |
| | | | | 174/250 |
| 8,180,546 | B2* | 5/2012 | Culbert | B60T 8/171 |
| | | | | 303/7 |
| 9,150,201 | B2* | 10/2015 | Smith | B60T 7/20 |
| 9,170,618 | B2* | 10/2015 | Liu | G06F 1/3209 |
| 10,379,153 | B1* | 8/2019 | Neves | G01R 31/2818 |
| 10,710,560 | B2* | 7/2020 | Prabhakar | B60T 17/22 |
| 2004/0195010 | A1* | 10/2004 | Fielding | G01R 31/2818 |
| | | | | 177/154 |
| 2005/0077780 | A1* | 4/2005 | Robertson | B60T 7/20 |
| | | | | 303/7 |
| 2005/0127747 | A1* | 6/2005 | Robertson | B60T 7/20 |
| | | | | 303/20 |
| 2006/0085715 | A1* | 4/2006 | Kim | G01R 31/31905 |
| | | | | 714/E11.171 |
| 2013/0127488 | A1* | 5/2013 | Rosenblatt | G01R 31/2818 |
| | | | | 324/756.01 |
| 2014/0229783 | A1* | 8/2014 | Qin | H05K 1/0268 |
| | | | | 714/734 |
| 2021/0405108 | A1* | 12/2021 | Strickling | G01R 31/2808 |

* cited by examiner

FIG. 8

CIRCUIT BOARD AND MONITORING METHOD THEREFOR

CROSS-REFERENCE TO RELATED APPLICATION

This non-provisional application claims priority under 35 U.S.C. § 119(a) to Patent Application No. 112109865 filed in Taiwan, R.O.C. on Mar. 16, 2023, the entire contents of which are hereby incorporated by reference.

BACKGROUND

Technical Field

The present disclosure relates to a circuit board and a monitoring method therefor.

Related Art

In current installation of a circuit board, the circuit board is locked by screws according to a pound number designated by a manufacturer, and then the circuit board is subjected to power-on test after being rechecked by inspection personnel.

However, when the pound number is not specified after the circuit board is locked by the screws, and the inspection personnel does not detect the problem, a system using the circuit board is at a high risk in operation, and wafers on the circuit board are likely to be damaged.

SUMMARY

In view of the above, a circuit board is provided. In an embodiment, the circuit board includes a board body, a main circuit, and a standby circuit. The main circuit is located on the board body. The standby circuit is located on the board body and is electrically connected to the main circuit. The standby circuit includes a first pressure detection circuit and a control circuit. The first pressure detection circuit is located at an area being monitored of the board body. The control circuit outputs a first signal and a second signal according to a first detection value and a first predetermined range of the first pressure detection circuit.

A circuit board monitoring method is further provided. In an embodiment, the circuit board monitoring method includes: detecting an area being monitored of the board body to obtain a pressure value; controlling a main power transmission circuit on the circuit board to output power when the pressure value falls within a predetermined range; and driving a warning element on the circuit board when the pressure value does not fall within the predetermined range.

DETAILED DESCRIPTION

Figure 1:
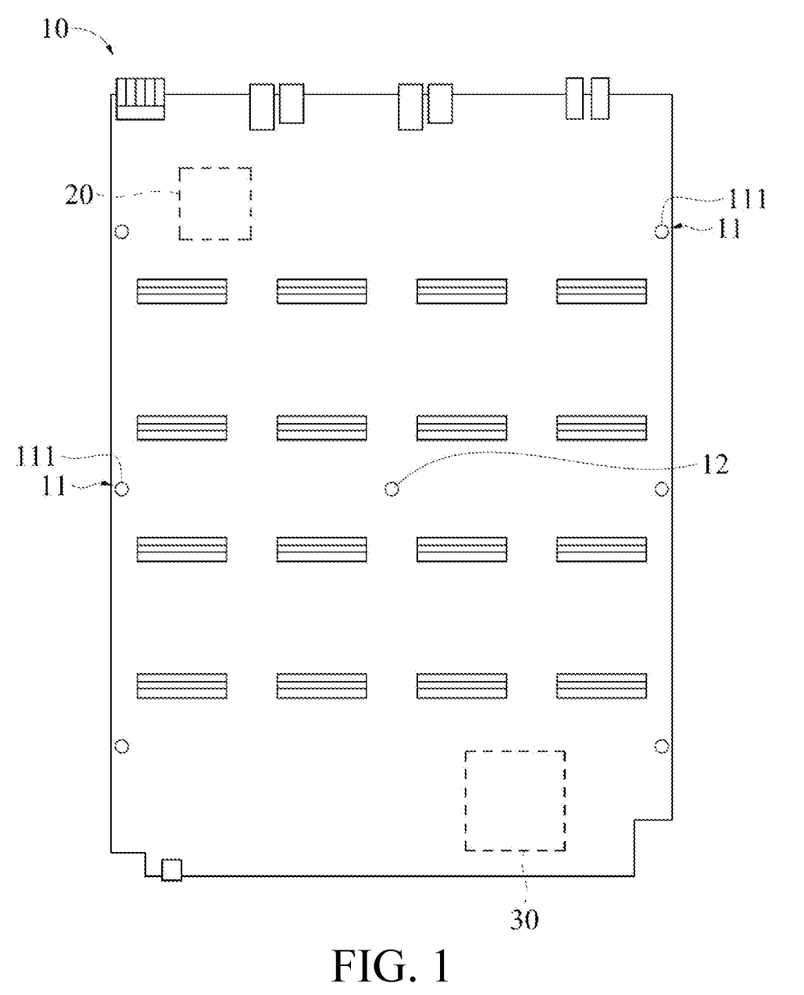
FIG. 1 is a schematic diagram of a circuit board in some embodiments.
Figure 2:
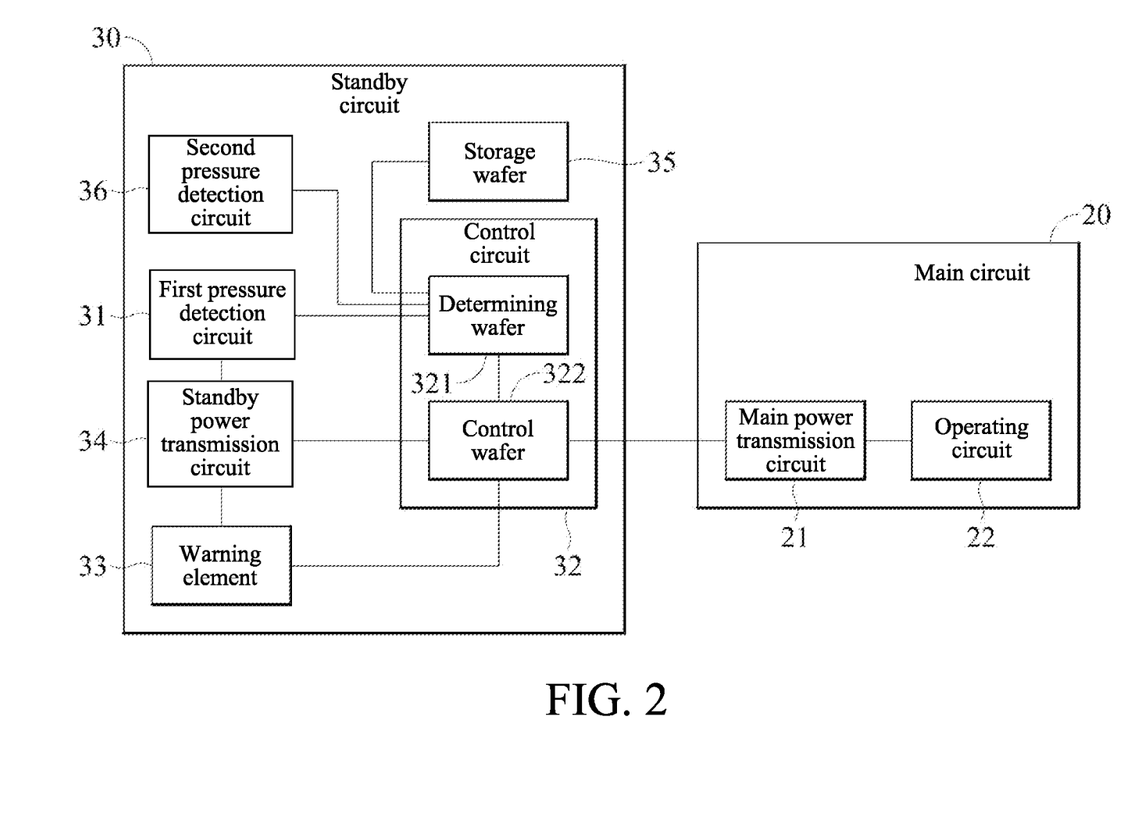
FIG. 2 is a schematic diagram of connection of various elements on the circuit board in some embodiments.

Referring to FIG. 1 and FIG. 2, in some embodiments, a circuit board includes a board body 10, a main circuit 20, and a standby circuit 30. An area 11 being monitored of the board body is an area where the circuit board possibly or easily deforms. Therefore, the area 11 may be a locking point, a fastening point or a clamping point of the board body 10, or may be a fastening position of a processor, a memory or a heat sink or a position nearby the fastening position. The main circuit 20 and the standby circuit 30 are respectively located on the board body 10, and the main circuit 20 is electrically connected to the standby circuit 30. In some embodiments, the main circuit 20 includes a plurality of electronic elements, such as a processor, a memory, and a hard disk (such as M.2 SSD). The standby circuit 30 is configured to determine whether power is output to the main circuit 20 or not. The standby circuit 30 includes a first pressure detection circuit 31 and a control circuit 32. The first pressure detection circuit 31 is electrically connected to the control circuit 32. The first pressure detection circuit 31 is located at the area 11 being monitored of the board body 10, and is configured to monitor pressure value applied to the area 11 to generate a first detection value (corresponding to the pressure value) to the control circuit 32. The control circuit 32 outputs a first signal or a second signal according to the first detection value and a first predetermined range. In some embodiments, the first signal corresponds to the first detection value falling within the first predetermined range, and the second signal corresponds to the first detection value not falling within the first predetermined range. That is, when the control circuit 32 determines that the first detection value falls within the first predetermined range, the control circuit 32 outputs the first signal; and when the control circuit 32 determines that the first detection value does not fall within the first predetermined range, the control circuit 32 outputs the second signal.

In some embodiments, the standby circuit 30 includes a warning element 33. The warning element 33 includes but is not limited to, a colored lamp, a display, a buzzer and the like. The warning element 33 is electrically connected to the control circuit 32, so that the warning element 33 is controlled by the control circuit 32. For example, when the warning element 33 is a colored lamp and the first detection value falls within the first predetermined range, the control circuit 32 controls the warning element 33 to emit green light. On the contrary, when the first detection value does not fall within the first predetermined range, the control circuit 32 controls the warning element 33 to emit red light. Or, when the warning element 33 is a buzzer and the first detection value falls within the first predetermined range, the control circuit 32 controls the warning element 33 to be stationary. On the contrary, when the first detection value does not fall within the first predetermined range, the control circuit 32 controls the warning element 33 to start making a sound.

In the present disclosure, the first pressure detection circuit 31 is configured to monitor the area 11 actively, and once the pressure applied to the area 11 is too high or too low (for example, the pressure does not meet the first predetermined range), the control circuit 32 may make a relative response, for example, the control circuit controls the warning element 33 to make a sound or emit a red light, so as to remind a related worker or personnel in a daily inspection station to pay attention. For example, when the area 11 is a screw hole, the first pressure detection circuit 31 may detect whether a screw is locked too tightly or loose, and the warning element 33 may remind the worker or the personnel in the daily inspection station to lock or release the screw, so as to meet the requirement on the pound number specified by the manufacturer. Or, the main circuit 20 is controlled to be in a shutdown state to prevent related electronic elements (such as a processor, a memory, and a hard disk) from being damaged or malfunctioning due to the deformation of the circuit board.

Referring to FIG. 1 and FIG. 2, in some embodiments, the standby circuit 30 includes a standby power transmission circuit 34, and the standby power transmission circuit 34 is electrically connected to the control circuit 32 and the first pressure detection circuit 31, respectively. When driven, the standby power transmission circuit 34 is configured to output power to the control circuit 32 and the first pressure detection circuit 31. In some embodiments, the standby power transmission circuit 34 is electrically connected to the warning element 33, and is configured to output power to the warning element 33 when driven. When the first detection value does not fall within the first predetermined range and the state lasts for a preset period of time, the control circuit 32 controls the standby power transmission circuit 34 to stop outputting power to the first pressure detection circuit 31 and the control circuit 32. That is, when the pressure applied to the area 11 being monitored of the board body 10 is too high or too low and the state lasts for a period of time (the control circuit 32 constantly sends out the second signal within the period of time), the control circuit 32 controls the standby power transmission circuit 34 to stop outputting power to the first pressure detection circuit 31 and the control circuit 32, so as to prevent deformation of the board body 10 from causing the error of power or electric signal. The period of time is preset so as to avoid the circumstance that the standby power transmission circuit 34 is electrically switched between a power-off state and a power-on state within a short time due to the fact that the first detection value does not fall within the first predetermined range within a short period of time due to noise or other reasons.

Referring to FIG. 2, in some embodiments, the main circuit 20 includes a main power transmission circuit 21 and an operating circuit 22. The operating circuit 22 includes a plurality of electronic elements (such as a processor, a memory, and a hard disk). The main power transmission circuit 21 is electrically connected to the control circuit 32 and the operating circuit 22, respectively. When driven by the control circuit 32, the main power transmission circuit 21 is configured to output power to the operating circuit 22. When the first detection value falls within the first predetermined range (indicating that the pressure detection result at the area 11 being monitored of the board body is normal), the control circuit 32 sends out a first signal to the main power transmission circuit 21. After receiving the first signal, the main power transmission circuit 21 outputs power to the operating circuit 22, at this moment, the circuit board is in a standby state (that is, the operating circuit 22 is powered on, but has not been started, and is still in a standby state, and a starting key is in an operable state). When a user issues a starting command (for example, the user presses the starting key), the operating circuit 22 starts the starting procedure (that is, various related elements in the operating circuit 22 start to operate), so that the circuit board turns to be in a starting state (normal operation state, for example, the circuit board displays a human-computer interface and allows the user to operate). On the contrary, when the first detection value does not fall within the first predetermined range, the control circuit 32 sends out a second signal to the main power transmission circuit 21. In some embodiments, after receiving the second signal, the main power transmission circuit 21 stops outputting power to the operating circuit 22. At this moment, the operating circuit 22 is not powered on, so even if the user issues the starting command (for example, the user presses the starting key), the operating circuit 22 will not operate, and the circuit board is kept in the standby state or a shutdown state so as to protect the electronic elements in the main circuit 20.

In some embodiments, after receiving the second signal, the main power transmission circuit 21 firstly sends out a shutdown command to the operating circuit 22, and after the operating circuit 22 completes a shutdown procedure, the main power transmission circuit 21 stops outputting power to the operating circuit 22. The applicable scenario of the present embodiment is: when the circuit board has been working normally for a period of time, the control circuit 32 determines that the first detection value does not fall within the first predetermined range and sends out the second signal to the main power transmission circuit 21. At this moment, due to the fact that the operating circuit 22 is still in operation, the main power transmission circuit 21 is not suitable to power off the operating circuit. Therefore, the main power transmission circuit 21 firstly sends out a shutdown command to the operating circuit 22, and after the operating circuit 22 completes the shutdown procedure, the main power transmission circuit 21 stops outputting power to the operating circuit 22. Thus, all the buffered data of the operating circuit 22 can be stored, and damage caused by sudden power failure is reduced.

Referring to FIG. 2, in some embodiments, the control circuit 32 includes a determining chip 321 and a control chip 322. The determining chip 321 is electrically connected to the first pressure detection circuit 31 and the control chip 322. The control chip 322 is electrically connected to the warning element 33, the standby power transmission circuit 34 and the main power transmission circuit 21. The determining chip 321 can be configured to receive a first detection value generated by the first pressure detection circuit 31, and determines the relationship between the first detection value and the first predetermined range. The determining chip 321 includes, but is not limited to, a BMC (baseboard management controller). The control chip 322 is configured to output a first signal or a second signal, and the control chip 322 includes, but is not limited to, a CPLD (complex programmable logic device), and an FPGA (field programmable gate array). Therefore, after obtaining the first detection value, the determining chip 321 may determine the relationship between the first detection value and the first predetermined range, and outputs an intermediate signal to the control chip 322, so that the control chip 322 outputs the first signal or the second signal according to the intermediate signal. The intermediate signal is used for indicating whether the first detection value falls within the first predetermined range or not, so that the intermediate signal represents the result that the first detection value falls within the first predetermined range or the result that the first detection value does not fall within the first predetermined range, and then, the control chip 322 can send out the first signal or second signal correspondingly according to the result. Specifically, when the determining chip 321 determines that the first detection value falls within the first predetermined range, the intermediate signal sent out by the determining chip 321 represents that the first detection value falls within the first predetermined range, and then, the control chip 322 sends out the first signal according to the intermediate signal. When the determining chip 321 determines that the first detection value does not fall within the first predetermined range, the intermediate signal sent out by the determining chip 321 represents that the first detection value does not fall within the first predetermined range, and then, the control chip 322 sends out the second signal according to the intermediate signal.

Referring to FIG. 2, in some embodiments, the standby circuit 30 includes a storage chip 35, the control circuit 32 is electrically connected to the storage chip 35, and the control circuit 32 stores detection results of the first pressure detection circuit 31 to the storage chip 35. In some embodiments, the determining chip 321 in the standby circuit 30 is electrically connected to the storage chip 35, the determining chip 321 is configured to store the determining results between the first detection value and the first predetermined range into the storage chip 35, so that the related worker can determine or improve conditions according to data in the storage chip 35. The frequency of the determining chip 321 determining whether the first detection value falls within the first predetermined range may be a first preset value, the frequency of the determining chip 321 storing the detection results may also be a second preset value, and the first preset value may be greater than or equal to the second preset value.

Figure 7:
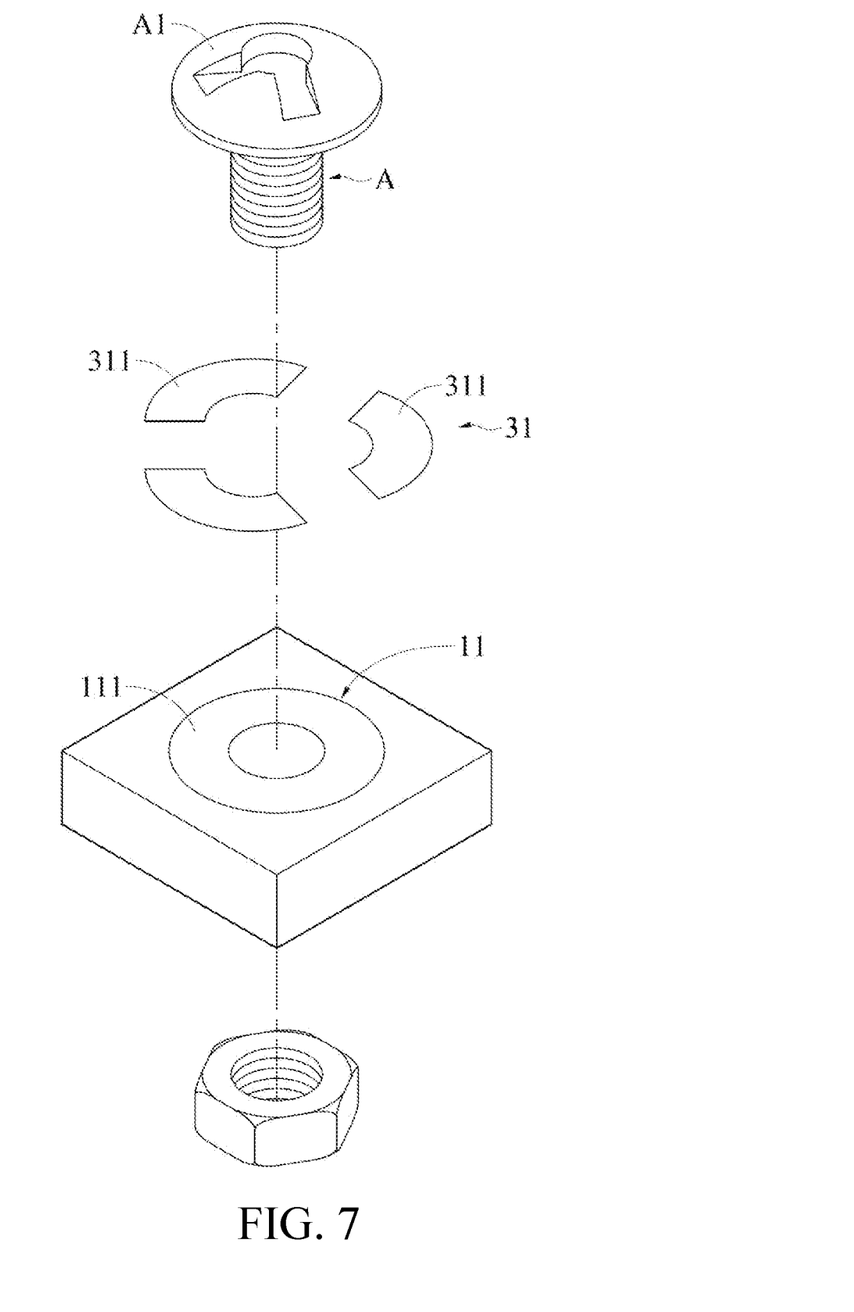
FIG. 7 is an exploded schematic diagram of screws, the first pressure detection circuit and an area being monitored of the board body in some embodiments.
Figure 8:
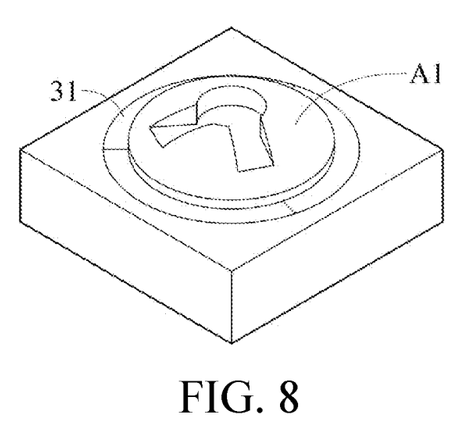
FIG. 8 is a schematic diagram of screws pressing against the first pressure detection circuit in some embodiments.

Referring to FIG. 1, FIG. 2, FIG. 7 and FIG. 8, in some embodiments, the area 11 includes a locking hole 111, and the first pressure detection circuit 31 is located at a position nearby the locking hole 111. The position nearby the locking hole refers to a position where the head A1 of a screw A may press at least one part of the first pressure detection circuit 31 after the screw A penetrates through the locking hole 111, or a position which can be detected by the first pressure detection circuit 31 when the locking pressure of the screw A is too high or too low. Therefore, the first pressure detection circuit 31 may be integrally located at a position nearby the locking hole 111, and may also be partially located at the position nearby the locking hole 111. In addition, the external contour of the first pressure detection circuit 31 may be a circular frame to surround the position nearby the locking hole 111, or the external contour of the first pressure detection circuit 31 may also be three arc bodies 311 as shown in FIG. 7, and the three arc bodies 311 are adjacently connected to one another to form a circular frame jointly. Moreover, the external contour of the first pressure detection circuit 31 is not limited to a circular frame, and may also be a rectangular frame, a polygonal frame or the like. Besides, the external contour of the first pressure detection circuit 31 is not limited to be frame-shaped, may also be circular, rectangular, polygonal or the like, and is arranged at the position nearby the locking hole 111, the number of the first pressure detection circuits is not limited to one, and a plurality of first pressure detection circuits may be arranged, and are arranged at the position nearby the locking hole 111 in a surrounding manner in a spaced manner.

Figure 3:
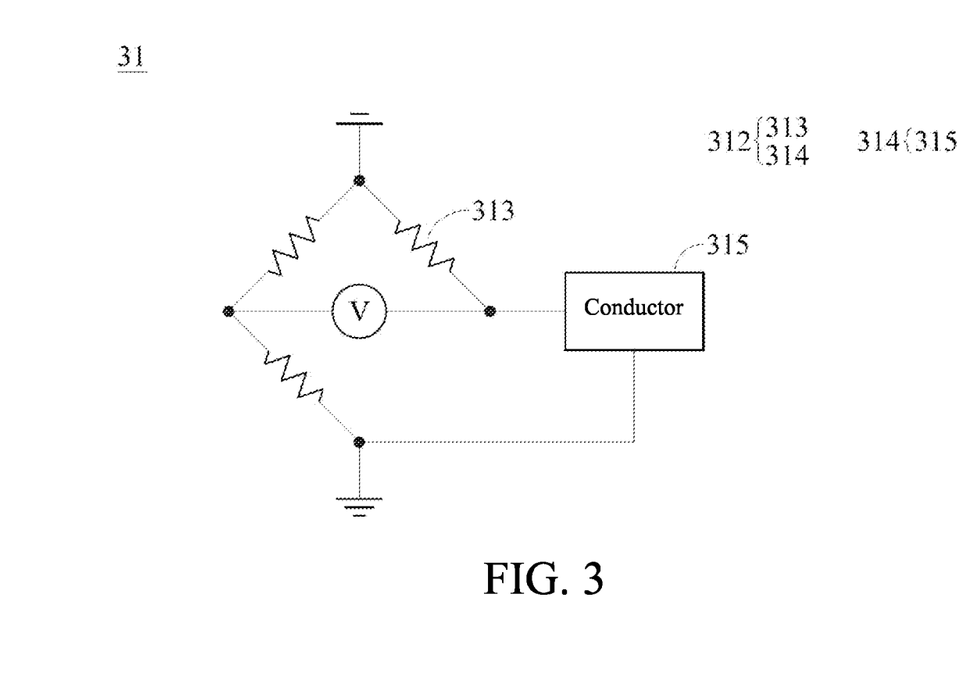
FIG. 3 is a schematic diagram of a first pressure detection circuit in some embodiments.

Referring to FIG. 1 and FIG. 3, the first pressure detection circuit 31 includes a Wheatstone bridge 312. The Wheatstone bridge 312 includes three first fixed resistors 313 and a variable resistor 314. The variable resistor 314 includes a conductor 315, the conductor 315 is arranged at a position nearby the locking hole 111, and the resistance value of the conductor 315 is substantially the same as the resistance values of the first fixed resistors 313. The conductor 315 may be a material which is electrically conductive, and can cause change of resistance after being subjected to pressure, including but not limited to copper. In some embodiments, the resistance value of the conductor 315 and the resistance values of the first fixed resistors 313 are lower than 120Ω, and the resistance value of the conductor 315 and the resistance values of the first fixed resistors 313 include but are not limited to 10Ω. In this embodiment, pressure applied to the head A1 (as shown in FIG. 7) is detected by change of the resistance of the conductor 315.

Figure 4:
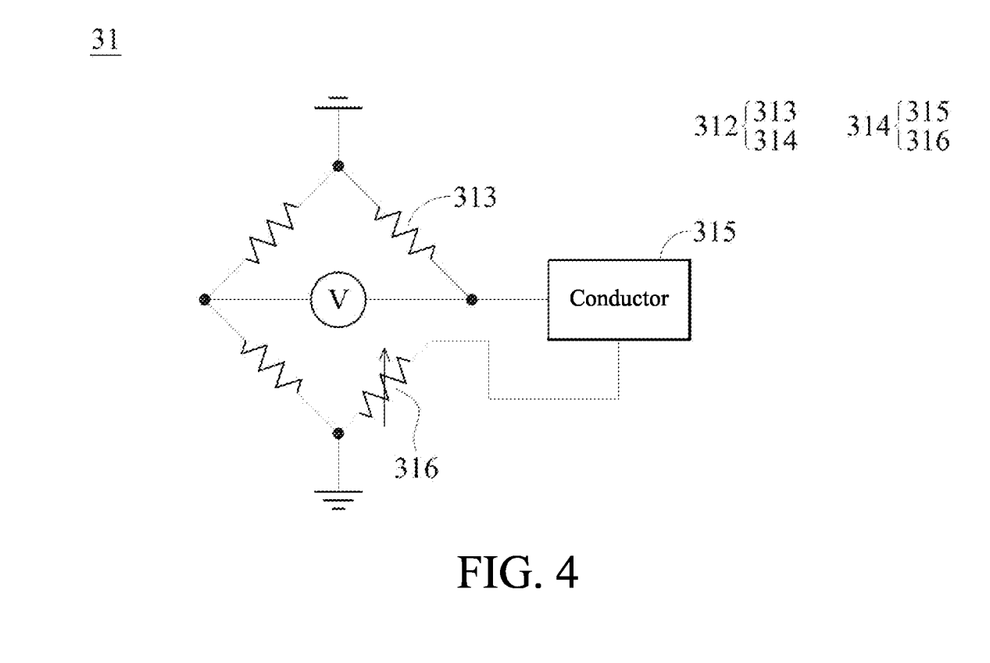
FIG. 4 is a schematic diagram of the first pressure detection circuit in some embodiments.

Referring to FIG. 1 and FIG. 4, in some embodiments, the first pressure detection circuit 31 includes a Wheatstone bridge 312. The Wheatstone bridge 312 includes three first fixed resistors 313 and a variable resistor 314. The variable resistor 314 includes a conductor 315 and a second fixed resistor 316. The conductor 315 is in series connection with the second fixed resistor 316, the conductor 315 is arranged at the area 11, and the resistance value of the variable resistor 314 is substantially the same as the resistance values of the first fixed resistors 313. In some embodiments, the resistance value of the variable resistor 314 and the resistance values of the first fixed resistors 313 may be 120Ω or 350Ω. Under the condition that the resistance value of the variable resistor 314 is 120Ω, the resistance value of the conductor 315 is 10Ω, the resistance value of the second fixed resistor 316 is 110Ω, and thus, after the conductor 315 and the second fixed resistor 316 are in series connection, the resistance value is 120Ω. In this embodiment, pressure applied to the head A1 (as shown in FIG. 7) is detected by change of the resistance of the conductor 315.

Figure 5:
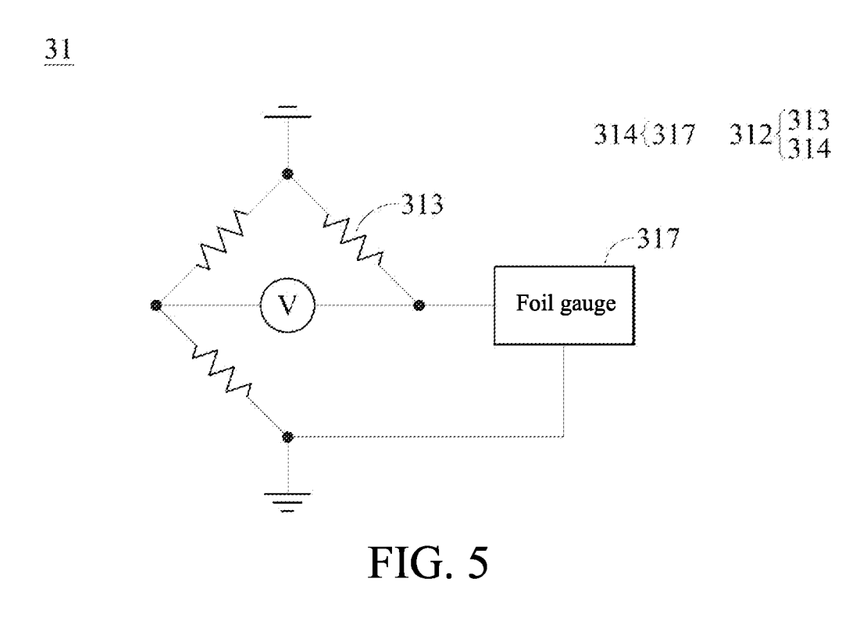
FIG. 5 is a schematic diagram of the first pressure detection circuit in some embodiments.

Referring to FIG. 1 and FIG. 5, in some embodiments, the first pressure detection circuit 31 includes a Wheatstone bridge 312. The Wheatstone bridge 312 includes three first fixed resistors 313 and a variable resistor 314, the variable resistor 314 includes a foil gauge 317, and the foil gauge 317 is arranged at the area 11. The foil gauge 317 includes but is not limited to a strain gauge. The resistance value of the foil gauge 317 is substantially the same as the resistance values of the first fixed resistors 313. In some embodiments, the resistance value of the foil gauge 317 and the resistance values of the first fixed resistors 313 are 120Ω or 350Ω. In this embodiment, the pressure applied to the head A1 (as shown in FIG. 7) is detected by the foil gauge 317.

Referring to FIG. 1 and FIG. 2, in some embodiments, the standby circuit 30 includes a second pressure detection circuit 36. The second pressure detection circuit 36 is electrically connected to the determining chip 321. The second pressure detection circuit 36 is arranged at another area 12 being monitored of the board body 10 (a second area being monitored of the board body to distinguish from the aforementioned area 11, and therefore the area 11 may be regarded as a first area being monitored of the board body). The second pressure detection circuit 36 is configured to detect whether various electronic elements of the operating circuit 22 are subjected to over high pressure, for example, the second pressure detection circuit 36 is configured to monitor whether too much force is applied to the memory to cause deformation when the memory is plugged or unplugged. The control circuit 32 is electrically connected to the second pressure detection circuit 36, and the control circuit 32 controls the warning element 33, the main power transmission circuit 21 and the standby power transmission circuit 34 according to a second detection value and a second predetermined range of the second pressure detection circuit 36. The control circuit 32 controls principles and functions of the warning element 33, the main power transmission circuit 21 and the standby power transmission circuit 34 according to a second detection value and a second predetermined range of the second pressure detection circuit 36, and the process is similar to the process of the control circuit 32 controlling the principles and functions of the warning element 33, the main power transmission circuit 21 and the standby power transmission circuit 34 according to the first detection value and the first predetermined range of the first pressure detection circuit 31, and will not be described herein again.

Figure 6:
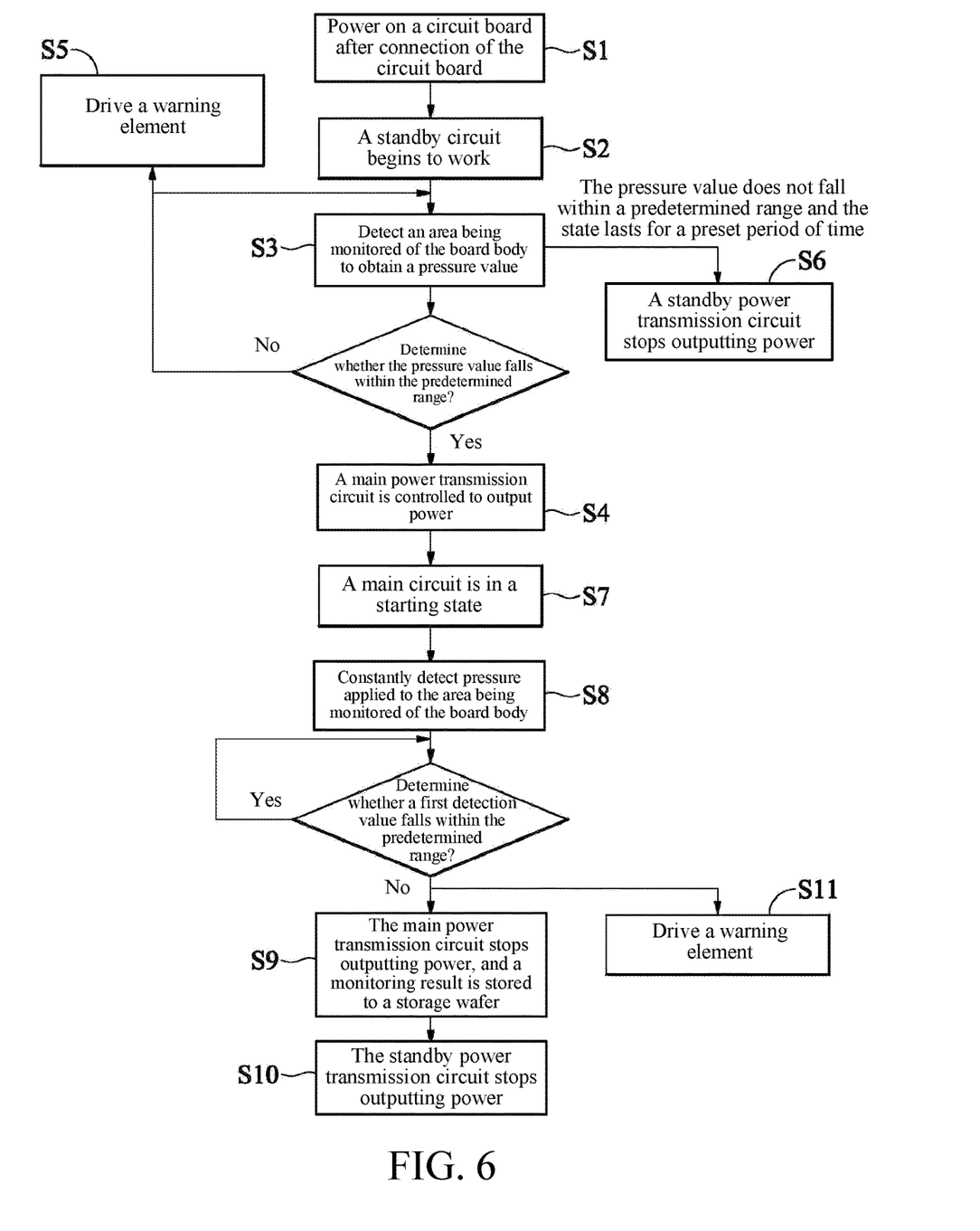
FIG. 6 is a flowchart of a circuit board monitoring method in some embodiments.

Referring to FIG. 1, FIG. 2 and FIG. 6, in some embodiments, a circuit board monitoring method includes:

step S3: a pressure value of an area 11 being monitored of the board body 10 is detected;

step S4: when the pressure value falls within a predetermined range, a main power transmission circuit 21 on the circuit board is controlled to output power; and step S5: when the first detection value does not fall within the predetermined range, a warning element 33 on the circuit board is driven.

In step S3, the pressure value of the area 11 may be detected by the first pressure detection circuit 31 located at the area 11, and the pressure value is output. Then, the control circuit 32 determines whether the pressure value falls within a predetermined range or not, when the pressure value falls within a predetermined range, step S4 is executed, and the control circuit 32 controls the main power transmission circuit 21 to output power; and when the pressure value does not fall within the predetermined range, step S5 is executed, and the control circuit 32 drives the warning element 33. In some embodiments, the first pressure detection circuit 31 is configured to monitor the pressure value applied to the area 11 so as to generate a first detection value, and the pressure value is forced to correspond to the first detection value.

In some embodiments, before step S3, the circuit board monitoring method further includes:

step S1: the circuit board is powered on after connection (such as fastening and clamping) of the circuit board; and step S2: the standby circuit 30 begins to work.

Therefore, after the circuit is locked and then powered on, the method is used to begin to monitor the circuit board.

In some embodiments, after step S5, the circuit monitoring method further includes:

step S6: when the pressure value does not fall within the predetermined range and the state lasts for a preset period of time, the standby power transmission circuit 34 on the circuit board is controlled to stop outputting power. That is, when the control circuit 32 determines that the pressure value does not fall within the predetermined range and the state lasts for a preset period of time, the control circuit will control the standby power transmission circuit 34 to stop outputting power to the control circuit 32, the first pressure detection circuit 31, the warning element 33 and/or the storage chip 35.

Referring to step S4 in FIG. 6, when the first detection value falls within a predetermined range, the control circuit 32 controls the main power transmission circuit 21 to output power to the operating circuit 22, so that the main circuit 20 (the circuit board) is in a standby state (namely a startable state). Then, when the user issues a starting command (for example, the user presses the starting key), the operating circuit 22 executes a starting procedure, and the main circuit 20 enters a starting state (step S7, namely the main circuit 20 is in an operation state).

Step S8: the first pressure detection circuit 31 constantly detects pressure applied to the area 11 (step S8). In some embodiments, when the first detection value does not fall within the predetermined range, the control circuit 32 may control the main power transmission circuit 21 to stop outputting power to the operating circuit 22 (step S9), or a shutdown command is firstly sent out to the operating circuit 22, and after the operating circuit 22 completes the shutdown procedure, the main power transmission circuit 21 then stops outputting power to the operating circuit 22 (another embodiment of step S9). Meanwhile, the control circuit 32 may also drive the warning element 33 (step S11). In some embodiments, after the main power transmission circuit 21 stops outputting power, the control circuit 32 may further control the standby power transmission circuit 34 to stop outputting power (step S10).

In addition, in some embodiments, before the operating circuit 22 carries out the shutdown procedure, the control circuit 32 stores the monitoring result in the storage chip 35 on the circuit board (another embodiment of step S9), so that the related worker can know the source of the pressure and improve the source of the pressure according to the content of the storage chip 35 at a later time. In some embodiments, in step S1, a screw A penetrates through the area 11 and is locked at an article, so that the circuit board is in a connection state.

Although the present disclosure has been described in considerable detail with reference to certain preferred embodiments thereof, the disclosure is not for limiting the scope of the invention. Persons having ordinary skill in the art may make various modifications and changes without departing from the scope and spirit of the disclosure. Therefore, the scope of the appended claims should not be limited to the description of the preferred embodiments described above.

What is claimed is:

1. A circuit board, comprising:
a board body;
a main circuit, located on the board body; and
a standby circuit, located on the board body, and electrically connected to the main circuit, the standby circuit comprising:
a first pressure detection circuit, located at an area being monitored of the board body; and
a control circuit, outputting a first signal or a second signal according to a first detection value and a first predetermined range of the first pressure detection circuit;
wherein the main circuit comprises a main power transmission circuit and an operating circuit; the control circuit outputs the first signal when the first detection value falls within the first predetermined range; and the control circuit outputs the second signal when the first detection value does not fall within the first predetermined range, and the main power transmission circuit stops outputting power to the operating circuit when receiving the second signal.

2. The circuit board according to claim 1, wherein the standby circuit comprises a warning element, and the control circuit drives the warning element when the first detection value does not fall within the first predetermined range.

3. The circuit board according to claim 1, wherein the main power transmission circuit outputs power to the operating circuit when receiving the first signal.

4. The circuit board according to claim 3, wherein the standby circuit comprises a standby power transmission circuit, the standby power transmission circuit is configured to output power to the control circuit and the first pressure detection circuit, and the control circuit controls the standby power transmission circuit to stop outputting power to the control circuit and the first pressure detection circuit when the first detection value does not fall within the first predetermined range and the state lasts for a preset period of time.

5. The circuit board according to claim 1, wherein the control circuit comprises a determining chip and a control chip, and the determining chip obtains the first detection value, and outputs an intermediate signal according to the first detection value and the first predetermined range; and the control chip outputs the first signal or the second signal according to the intermediate signal.

6. The circuit board according to claim 1, wherein the standby circuit comprises a storage wafer, the control circuit is electrically connected to the storage wafer, and the control circuit stores detection results of the first pressure detection circuit to the storage wafer.

7. The circuit board according to claim 1, wherein the area being monitored of the board body comprises a locking hole, and the first pressure detection circuit is located at a position nearby the locking hole.

8. The circuit board according to claim 7, wherein the first pressure detection circuit comprises a Wheatstone bridge, the Wheatstone bridge comprises three first fixed resistors and a variable resistor, the variable resistor comprises a conductor, the conductor is located at a position nearby the locking hole, and the resistance value of the conductor is substantially the same as the resistance values of the first fixed resistors.

9. The circuit board according to claim 8, wherein the resistance value of the conductor and the resistance values of the first fixed resistors are lower than 120Ω.

10. The circuit board according to claim 7, the first pressure detection circuit comprises a Wheatstone bridge, the Wheatstone bridge comprises three first fixed resistors and a variable resistor, the variable resistor comprises a conductor and a second fixed resistor, the conductor is in series connection with the second fixed resistor, the conductor is arranged at the area being monitored of the board body, and the resistance value of the variable resistor is substantially the same as the resistance values of the first fixed resistors.

11. The circuit board according to claim 10, wherein the resistance value of the variable resistor and the resistance values of the first fixed resistors are 120Ω or 350Ω.

12. The circuit board according to claim 7, wherein the first pressure detection circuit comprises a Wheatstone bridge, the Wheatstone bridge comprises three first fixed resistors and a variable resistor, the variable resistor comprises a foil gauge, the foil gauge is arranged at the area being monitored of the board body, and the resistance value of the foil gauge is substantially the same as the resistance values of the first fixed resistors.

13. The circuit board according to claim 12, wherein the resistance value of the foil gauge and the resistance values of the first fixed resistors are 120Ω or 350Ω.

14. The circuit board according to claim 4, wherein the standby circuit comprises a second pressure detection circuit located at another area being monitored of the board body, the control circuit is electrically connected to the second pressure detection circuit, and the control circuit controls the main power transmission circuit and the standby power transmission circuit according to a second detection value and a second predetermined range of the second pressure detection circuit.

15. A circuit board monitoring method, comprising:
    detecting an area being monitored of the board body to obtain a pressure value;
    controlling a main power transmission circuit on the circuit board to output power when the pressure value falls within a predetermined range; and
    driving a warning element on the circuit board when the pressure value does not fall within the predetermined range;
    controlling a control circuit on the circuit board to output a first signal when the pressure value falls within the predetermined range;
    controlling the control circuit to output a second signal when the pressure value does not fall within the predetermined range;
    the main power transmission circuit stops outputting power to an operating circuit on the circuit board when receiving the second signal.

16. The circuit board monitoring method according to claim 15, wherein when the pressure value does not fall within the predetermined range and the state lasts for a preset period of time, the standby power transmission circuit on the circuit board is controlled to stop outputting power.

17. The circuit board monitoring method according to claim 16, wherein when the pressure value does not fall within the predetermined range, the main power transmission circuit is controlled to stop outputting power.

18. The circuit board monitoring method according to claim 15, wherein when the pressure value does not fall within the predetermined range, the monitoring result of the area being monitored of the board body is stored to the storage wafer on the circuit board.

19. The circuit board monitoring method according to claim 18, wherein after a storage step, a shutdown procedure is started.

* * * * *